(12) United States Patent
Shiroishi

(10) Patent No.: US 12,281,752 B2
(45) Date of Patent: Apr. 22, 2025

(54) HANGING MECHANISM

(71) Applicant: DAIFUKU CO., LTD., Osaka (JP)

(72) Inventor: Keisuke Shiroishi, Gamo-gun (JP)

(73) Assignee: Daifuku Co., Ltd., Osaka (JP)

( * ) Notice: Subject to any disclaimer, the term of this patent is extended or adjusted under 35 U.S.C. 154(b) by 0 days.

(21) Appl. No.: 18/152,393

(22) Filed: Jan. 10, 2023

(65) Prior Publication Data

US 2023/0228375 A1    Jul. 20, 2023

(30) Foreign Application Priority Data

Jan. 19, 2022    (JP) ................. 2022-006757

(51) Int. Cl.
*F16M 13/02* (2006.01)
*B65G 1/02* (2006.01)

(52) U.S. Cl.
CPC ............ *F16M 13/027* (2013.01); *B65G 1/02* (2013.01)

(58) Field of Classification Search
CPC .. F16M 13/027; B65G 1/02; H01L 21/67383; H01L 21/67733; H01L 21/67769
See application file for complete search history.

(56) References Cited

U.S. PATENT DOCUMENTS

| | | | | |
|---|---|---|---|---|
| 3,033,628 A * | 5/1962 | Hoffman | ............... | F16M 13/027 211/117 |
| 5,564,664 A * | 10/1996 | Oschwald | ................. | G12B 5/00 403/111 |
| 7,510,160 B1 * | 3/2009 | Wang | .................... | F04D 29/601 416/246 |
| 8,091,849 B2 * | 1/2012 | Ayadhi | ............... | F16M 11/2092 248/323 |
| 2021/0272830 A1 | 9/2021 | Tsubaki et al. | | |
| 2021/0347567 A1 | 11/2021 | Torazawa et al. | | |
| 2022/0267093 A1 * | 8/2022 | Takahara | ............. | B65G 1/1373 |

FOREIGN PATENT DOCUMENTS

| | | |
|---|---|---|
| JP | 2005-298201 A | 10/2005 |
| JP | 2018-043867 A | 3/2018 |
| JP | 2020-075819 A | 5/2020 |
| WO | WO-2020/017137 A1 | 1/2020 |

OTHER PUBLICATIONS

Office Action for Japanese Patent Application No. 2022-006757 dated Jul. 9, 2024 and Machine Translation thereof.

* cited by examiner

*Primary Examiner* — Anita M King
(74) *Attorney, Agent, or Firm* — Harness, Dickey & Pierce, P.L.C.

(57) ABSTRACT

In order to facilitate horizontally hanging an object, a hanging mechanism includes: a first hanging shaft to be hung from a ceiling; a second hanging shaft supported so as to be hung from the first hanging shaft; and a connecting section connecting the first hanging shaft and the second hanging shaft. The connecting section includes: a protruding spherical surface of a first connecting member that is provided on the first hanging shaft side; and a recessed surface portion, which is a recessed spherical surface of a second connecting member that is provided on the second hanging shaft side and that is in contact with the spherical surface of the first connecting member.

9 Claims, 3 Drawing Sheets

HANGING MECHANISM

This Nonprovisional application claims priority under 35 U.S.C. § 119 on Patent Application No. 2022-006757 filed in Japan on Jan. 19, 2022, the entire contents of which are hereby incorporated by reference.

TECHNICAL FIELD

The present invention relates to a hanging mechanism.

BACKGROUND ART

A known storage shelf for storing an object is hung from a support part such as a ceiling. For example, Patent Literature 1 discloses a storage shelf whose shelf module is hung from a ceiling with use of a hanging frame.

CITATION LIST

Patent Literature

Patent Literature 1

International Publication No. WO 2020/017137

SUMMARY OF INVENTION

Technical Problem

The above-described hanging frame includes a fixing portion which is directly fixed to a ceiling and a hanging portion which extends downward from the fixing portion. With use of the hanging portion, the hanging frame hangs the shelf module. In a case where the ceiling is tilted and/or in a case where such a hanging frame is improperly fixed to the ceiling, the hanging frame may be fixed to the ceiling such that the hanging frame is tilted with respect to a horizontal plane. This case leads to a problem in that the shelf module fails to be hung horizontally via the hanging frame.

It is an object of an aspect of the present invention to achieve a hanging mechanism that makes it easy to horizontally hang an object.

Solution to Problem

In order to solve the foregoing problem, a hanging mechanism in accordance with an aspect of the present invention includes: a first hanging member to be hung from a support part; a second hanging member supported so as to be hung from the first hanging member; and a connecting section connecting the first hanging member and the second hanging member to each other, the connecting section including: a first connecting surface that is provided on a first hanging member side; and a second connecting surface that is provided on a second hanging member side and that is in contact with the first connecting surface. One of the first connecting surface and the second connecting surface is a protruding curved surface, and the other of the first connecting surface and the second connecting surface is a recessed curved surface.

Advantageous Effects of Invention

An aspect of the present invention makes it possible to achieve a hanging mechanism which makes it easy to horizontally hang an object.

DESCRIPTION OF EMBODIMENTS

[Configuration of Transfer System]

Figure 1:
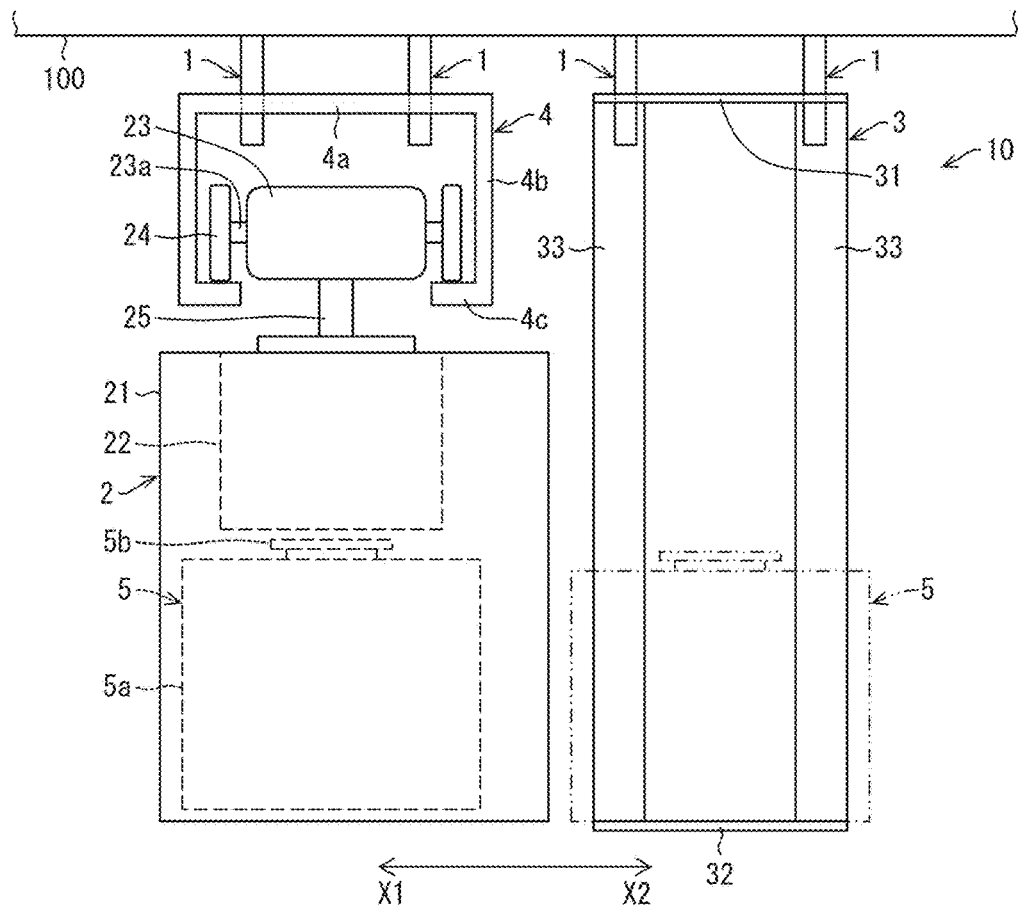
FIG. 1 is a front view illustrating a configuration of a transfer system in which a hanging mechanism in accordance with Embodiment 1 or 2 of the present invention is used.

The following will describe, with reference to FIG. 1, a transfer system 10 in which a hanging mechanism in accordance with an embodiment of the present invention is used. FIG. 1 is a front view illustrating a configuration of the transfer system 10.

As illustrated in FIG. 1, the transfer system 10 is provided so as to be hung from a ceiling 100 (support part). The transfer system 10 includes a hanging mechanism 1, a ceiling carrier 2, a storage shelf 3 (storage body), and a rail 4.

The hanging mechanism 1 hangs the storage shelf 3 and the rail 4 from the ceiling 100. The hanging mechanism 1 will be described in detail in Embodiments 1 and 2 that will be described later.

The rail 4 is disposed on a movement path of the ceiling carrier 2 and includes an upper surface portion 4a, a pair of side portions 4b, and a pair of lower surface portions 4c. The upper surface portion 4a is a portion attached to the hanging mechanism 1, and is disposed so as to face to the ceiling 100. The side portions 4b are respective side walls which are provided so as to hang down from both side edges of the upper surface portion 4a. The lower surface portions 4c are formed to be short and to extend, on inner wall surface sides of the side portions 4b, from respective lower edges of the side portions 4b. The lower surface portions 4c form track surfaces on which wheels 24 provided to the ceiling carrier 2 roll. The wheels 24 will be described later.

The ceiling carrier 2, while hanging from the rail 4, travels along the rail 4 to transport a container 5 (object) to a destination. The container 5 includes a main body 5a in which objects, such as a wafer and a reticle that are used for manufacturing semiconductors, are accommodated. The ceiling carrier 2 includes a box 21, a transfer mechanism 22, a driving part 23, the wheels 24, and a supporting shaft 25.

The box 21 accommodates the container 5. The transfer mechanism 22 is disposed in an upper portion of the box 21.

The box 21 is open on one side-surface side such that the container 5 can be taken in and out.

The transfer mechanism 22 transfers the container 5 by moving the container 5 from the box 21 to the storage shelf 3 and also from the storage shelf 3 to the box 21. The transfer mechanism 22 includes a mechanism for holding a flange portion 5b that is provided on a top surface of the main body 5a, and a mechanism for forward movement in an X2 direction in FIG. 1 and backward movement in an X1 direction in FIG. 1.

The driving part 23 generates power for driving the wheels 24, and is composed of a motor and the like. The driving part 23 includes a driving shaft 23a. The driving shaft 23a is provided so as to protrude toward the wheels 24 and is directly connected with an axle of the wheels 24. The wheels 24 are disposed at positions at which the wheels 24 roll on respective top surfaces of the lower surface portions 4c.

The supporting shaft 25 is a shaft member which supports the box 21 such that the box 21 is hung from the driving part 23. The supporting shaft 25 is provided so as to connect a bottom surface of the driving part 23 and a top surface of the box 21.

The storage shelf 3 is provided at a location where the storage shelf 3 is necessary on the rail 4 and temporarily stores a container transferred from the ceiling carrier 2. The storage shelf 3 is provided as a side track buffer (STB), an under track storage (UTS), or the like.

The storage shelf 3 includes a top board 31, a bottom board 32, and connecting members 33. The top board 31 is a plate-like rectangular member attached to the hanging mechanism 1. The bottom board 32 is a plate-like rectangular member that is disposed below the top board 31 so as to be located opposite the top board 31. The container 5 is placed on the bottom board 32. The number of the connecting members 33 provided is four, and the connecting members 33 connect four corners of the bottom surface of the top board 31 and four corners of a top surface of the bottom board 32.

Note that the hanging mechanism 1 may be supported on the ceiling 100 via a double-axis position adjustment mechanism (not illustrated). The double-axis position adjustment mechanism adjusts, in a horizontal plane, a position of each of the storage shelf 3 and the rail 4, which are hung by the hanging mechanism 1, in the X1 and X2 directions of FIG. 1 with respect to the ceiling 100 and in a direction perpendicular to the X1 and X2 directions. The double-axis position adjustment mechanism functions as the support part instead of the ceiling 100.

Embodiment 1

The following will describe an embodiment of the present invention, with respect to FIGS. 2 to 6.

Figure 2:
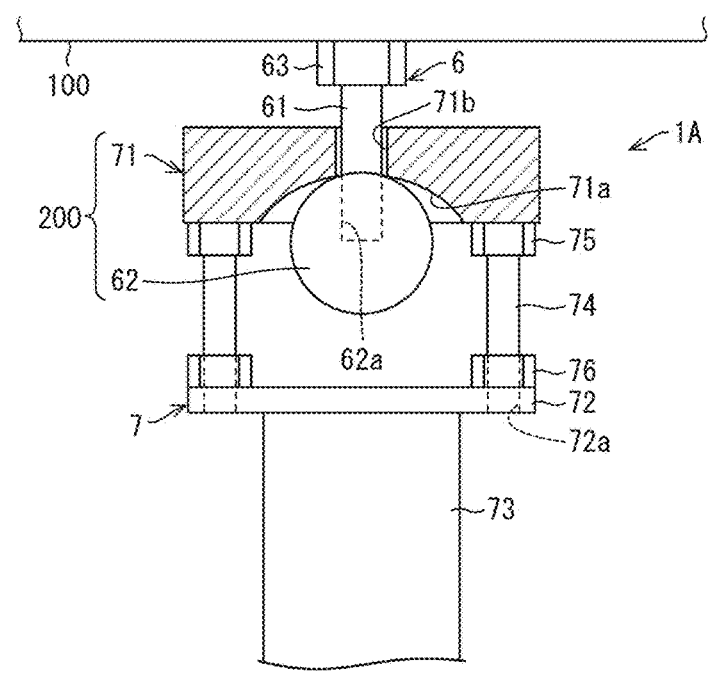
FIG. 2 is a partial cross-sectional view illustrating a configuration of a hanging mechanism in accordance with Embodiment 1.
Figure 3:
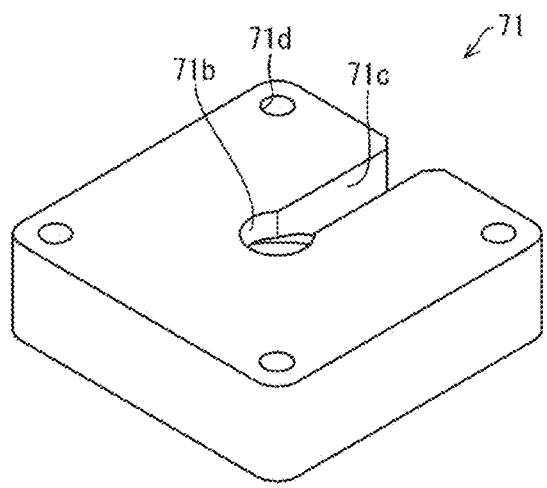
FIG. 3 is a perspective view illustrating a configuration (as viewed from above) of a connecting member in the hanging mechanism.
Figure 4:
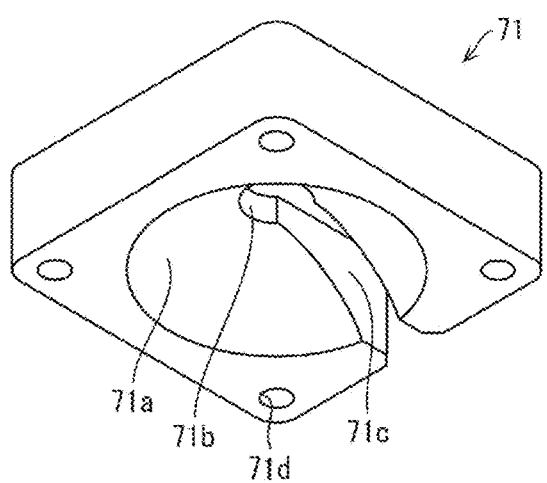
FIG. 4 is a perspective view illustrating a configuration (as viewed from below) of the connecting member.
Figure 5:
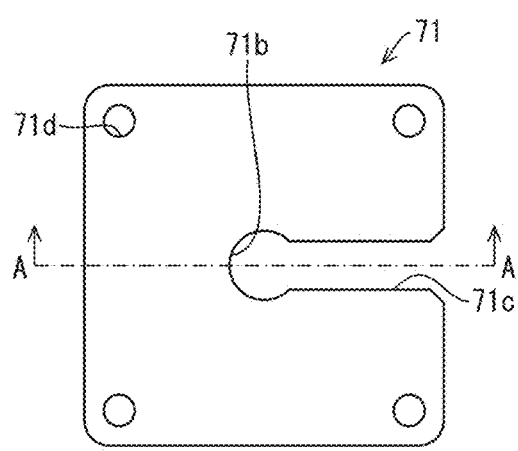
FIG. 5 is a plan view illustrating a configuration of the connecting member.
Figure 6:
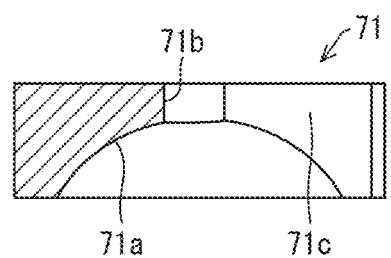
FIG. 6 is a cross-sectional view taken along line A-A in a direction of arrows in FIG. 5.

FIG. 2 is a partial cross-sectional view illustrating a configuration of a hanging mechanism 1A in accordance with Embodiment 1. FIG. 3 is a perspective view illustrating a configuration (as viewed from above) of a connecting member 71 in the hanging mechanism 1A. FIG. 4 is a perspective view illustrating a configuration (as viewed from below) of the connecting member 71. FIG. 5 is a plan view illustrating a configuration of the connecting member 71. FIG. 6 is a cross-sectional view taken along line A-A in a direction of arrows in FIG. 5.

The hanging mechanism 1A illustrated in FIG. 2 is used in the transferring system 10, as the above-described hanging mechanism 1. As illustrated in FIG. 2, the hanging mechanism 1A includes an upper mechanism 6 and a lower mechanism 7. The upper mechanism 6 is supported on the ceiling 100. The lower mechanism 7 is hung from the upper mechanism 6 so as to be connected with the upper mechanism 6.

The upper mechanism 6 includes a hanging shaft 61 (first hanging member), a connecting member 62, and a nut 63. Although not illustrated, the hanging shaft 61 has a top end portion that penetrates through the ceiling 100 so as to protrude on an upper surface side of the ceiling 100. A male screw is formed at each of an outer circumference of the top end portion and an outer circumference of a bottom end portion of the hanging shaft 61. The nut 63 is fitted onto the hanging shaft 61. When rotated, the nut 63 moves in an axial direction of the hanging shaft 61. In addition, a nut (upper nut) which is not illustrated is fitted onto the top end portion of the hanging shaft 61.

The upper nut and the nut 63 sandwich the ceiling 100, so that the hanging shaft 61 is fixed to the ceiling 100. Further, rotation of the upper nut and the nut 63 moves, upward or downward, the hanging shaft 61 with respect to the upper nut and the nut 63. In this way, the hanging shaft 61, the upper nut, and the nut 63 constitute a height adjustment mechanism (first height adjustment mechanism).

The connecting member 62 has a protruding curved surface (first connecting surface), specifically, a protruding spherical surface. The connecting member 62 has a spherical shape, but does not necessarily have a spherical shape. The connecting member 62 may have, for example, a hemispherical shape as long as the connecting member 62 has a protruding spherical surface as a surface to be in contact with a recessed surface portion 71a of the connecting member 71 (described later).

The connecting member 62 is connected with the bottom end portion of the hanging shaft 61. Specifically, the connecting member 62 is provided with a hole 62a having a female screw that is formed from an upper end to the center of the connecting member 62. The bottom end portion of the hanging shaft 61 and the hole 62a of the connecting member 62 are connected with each other by screw-fitting. Rotation of the connecting member 62 with respect to the hanging shaft 61 moves, upward or downward, a screw-fitting position of the connecting member 62 and the hanging shaft 61. This can change a height at which the connecting member 62 is connected with the hanging shaft 61. In this way, the hanging shaft 61 and the connecting member 62, which are screw-fitted to each other, constitute a height adjustment mechanism (first height adjustment mechanism).

The lower mechanism 7 includes the connecting member 71, a supporting board 72, a hanging shaft 73 (second hanging member), connecting shafts 74, and nuts 75 and 76. Four sets of a connecting shaft 74 and nuts 75 and 76 are provided.

As illustrated in FIGS. 3 to 6, the connecting member 71 has a substantially square shape as viewed from above and has a predetermined thickness. The connecting member 71 has the recessed surface portion 71a (second connecting surface) that forms a recessed curved surface, specifically, a recessed spherical surface. The recessed surface portion 71a is formed at a center of a bottom surface of the connecting member 71. The recessed surface portion 71a has a larger curvature radius than the connecting member 62.

The recessed surface portion 71a is provided, at the center thereof, with a shaft hole 71b that is formed so as to penetrate through the connecting member 71 from the recessed surface portion 71a to a top surface of the connecting member 71. The shaft hole 71b is formed so as to have a size, that is, a diameter large enough to prevent an inner wall surface of the connecting member 71, which defines the shaft hole 71*b*, from touching the hanging shaft 61 even in a case where the center of the shaft hole 71*b* is tilted at a predetermined angle with respect to the hanging shaft 61.

The connecting member 71 is provided with a cut 71*c* that communicates with the shaft hole 71*b*. The cut 71*c* is linearly formed from one end at a position on a side edge of the shaft hole 71*b* to the other end on one of side surfaces of the connecting member 71. The cut 71*c* is formed so as to have a width that is slightly larger than the diameter of the hanging shaft 61 and that is smaller than the diameter of the shaft hole 71*b*. In addition, the connecting member 71 is provided with a screw hole 71*d* that is formed at each of four corners of the connecting member 71.

The connecting shaft 74 is provided with a male screw that is formed at each of an outer circumference of a top end portion and an outer circumference of a bottom end portion of the connecting shaft 74. The male screw of the top end portion of the connecting shaft 74 is screw-fitted to the screw hole 71*d*. The nuts 75 are each fitted onto the top end portion of the connecting shaft 74. Rotation of the nut 75 moves, upward or downward, the top end portion of the connecting shaft 74 in the screw hole 71*d*. As a result, the connecting shaft 74 moves upward or downward with respect to the nut 75. In this way, the connecting shaft 74 and the nut 75 constitute a height adjustment mechanism (second height adjustment mechanism).

The supporting board 72 is a plate-like member that has a substantially square shape. The supporting board 72 is provided with a screw hole 72*a* at each of four corners of the supporting board 72. The screw hole 72*a* is formed at a position opposite the screw hole 71*d*. The male screw of the bottom end portion of the connecting shaft 74 is fitted into the screw hole 72*a*. The nut 76 is fitted onto the bottom end portion of the connecting shaft 74. Rotation of the nut 76 moves, upward or downward, the bottom end portion of the connecting shaft 74 in the screw hole 72*a*. As a result, the connecting shaft 74 moves upward or downward with respect to the nut 76. In this way, the connecting shaft 74 and the nut 76 constitute the height adjustment mechanism (second height adjustment mechanism).

The hanging shaft 73 is jointed to a lower surface of the supporting board 72. The hanging shaft 73 is provided so as to extend downward and is connected with the corresponding one of the top board 31 of the storage shelf 3 and the upper surface portion 4*a* of the rail 4.

In the hanging mechanism LA, the connecting member 62 and the connecting member 71 constitute a connecting section 200. The connecting section 200 connects the hanging shaft 61 and the hanging shaft 73.

In the connecting section 200 of the hanging mechanism 1A configured as described above, the connecting member 62 is in contact with the recessed surface portion 71*a* of the connecting member 71. Thus, the recessed surface portion 71*a* of the connecting member 71 slides with respect to the spherical surface of the connecting member 62. Therefore, even in a case where the hanging shaft 61 is tilted with respect to a horizontal plane because the ceiling 100 is not horizontal but tilted and/or because the hanging shaft 61 is improperly fixed to the ceiling 100, the hanging shaft 73 can be directed vertically downward whereas the hanging shaft 61 is tilted. This makes it possible to easily keep the storage shelf 3, which is an object hung by the hanging shaft 73, horizontal. In addition, it is possible to attenuate lateral oscillation in a case where the lower mechanism 7 is oscillated laterally together with the storage shelf 3 or portions located lower than the rail 4. As a result, it is possible to attenuate influence of the lateral oscillation on the upper mechanism 6.

Furthermore, the spherical surface of the connecting member 62 is a protruding spherical surface, and the recessed surface portion 71*a* of the connecting member 71 is a recessed spherical surface. This allows the connecting member 62 to smoothly contact the recessed surface portion 71*a*. Thus, the connecting member 62 and the recessed surface portion 71*a* easily slide with respect to each other. This makes it possible to easily keep the storage shelf 3 horizontal. In addition, this makes it possible to enhance the effect of attenuating the lateral oscillation that occurs at portions located lower than the lower mechanism 7.

Furthermore, the recessed surface portion 71*a* of the connecting member 71 has a larger curvature radius than the connecting member 62. This reduces an area in which the spherical surface of the connecting member 62 is in contact with the recessed surface portion 71*a* of the connecting member 71. Thus, the recessed surface portion 71*a* can more freely move with respect to the connecting member 62. In contrast, in a case where the spherical surface of the connecting member 62 has the same curvature radius as the recessed surface portion 71*a* of the connecting member 71, the respective spherical surfaces are fitted to each other. This makes the recessed surface portion 71*a* unable to freely move with respect to the connecting member 62.

Furthermore, the connecting member 71 has the cut 71*c*. Thus, the lower mechanism 7 including the hanging shaft 73 can be detachably connected to the upper mechanism 6, by horizontally moving the connecting member 71 in a manner that the hanging shaft 61 of the upper mechanism 6 moves along the cut 71*c*. This makes it possible to bring, to an installation location of the hanging mechanism LA, the hanging mechanism LA in the form of separate parts, that is, the upper mechanism 6 including the hanging shaft 61 and the lower mechanism 7 including the hanging shaft 73.

As a result of fitting of the connecting member 62 and the nut 63 with respect to the hanging shaft 61, constituted is the height adjustment mechanism (first height adjustment mechanism) for adjusting the height of the connecting member 62 with respect to the ceiling 100. On the other hand, as a result of fitting of the nuts 75 and 76 with respect to the connecting shafts 74, constituted is the height adjustment mechanism (second height adjustment mechanism) for adjusting the height of the hanging shaft 73 with respect to the connecting member 62.

This makes it possible to adjust the respective heights of the connecting member 62 and the hanging shaft 73 in a condition where the hanging mechanism 1A is in the form of separate parts, that is, the upper mechanism 6 and the lower mechanism 7. Therefore, in a case where a heavy load is attached to the hanging shaft 73, the lower mechanism 7 and the upper mechanism 6 are connected with each other after the heights of the connecting member 62 and the hanging shaft 73 have been adjusted. This eliminates the need for adjusting the heights in a condition where the heavy load is attached. As a result, it is possible to reduce a burden of adjusting the heights.

Furthermore, the upper mechanism 6 is provided with the connecting member 62 in which the protruding curved surface (protruding spherical surface) is formed, and the lower mechanism 7 is provided with the connecting member 71 in which the recessed curved surface (recessed spherical surface) is formed. As a result, in height adjustment of the upper mechanism 6, only the connecting member 62 and the nut 63, that is, only two parts, are to be adjusted. This can simplify the adjustment of the heights.

Furthermore, the storage shelf 3 for accommodating the container 5 is attached to the hanging shaft 73. Therefore, it is possible to easily keep the storage shelf 3 horizontal. This makes it possible to stably accommodate the container 5. In addition, even in a case where the storage shelf 3 oscillates laterally, it is possible to attenuate the lateral oscillation. The attenuation of the lateral oscillation also makes it possible to stably accommodate the container 5.

Furthermore, the rail 4 on which the ceiling carrier 2 travels is attached to the hanging shaft 73. Therefore, it is possible to easily keep the ceiling carrier 2, which travels on the rail 4, horizontal. This allows the ceiling carrier 2 to stably travel. In addition, even in a case where the ceiling carrier 2 oscillates laterally, it is possible to attenuate the lateral oscillation. The attenuation of the lateral oscillation also allows the ceiling carrier 2 to stably travel.

Embodiment 2

Figure 7:
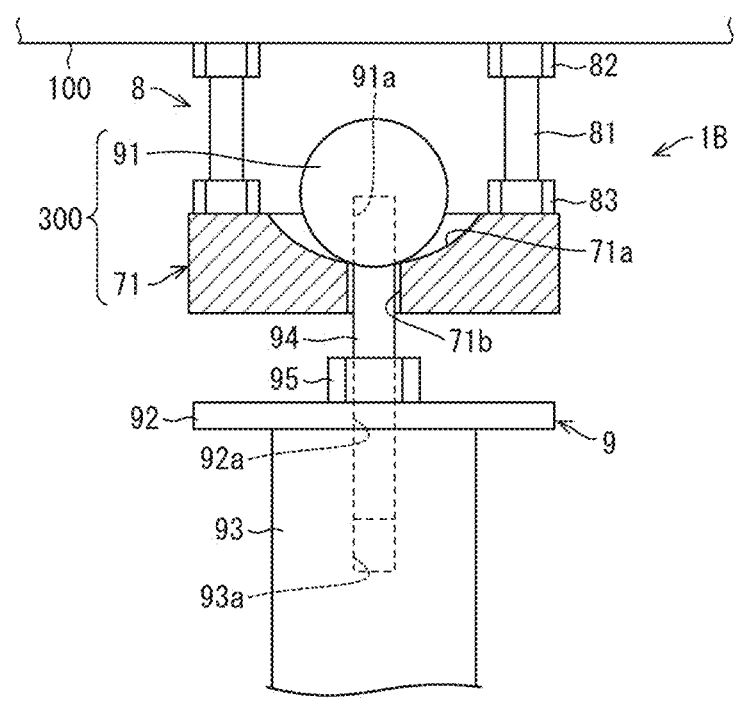
FIG. 7 is a longitudinal cross-sectional view illustrating a configuration of a hanging mechanism in accordance with Embodiment 2 of the present invention.

The following will describe another embodiment of the present invention, with reference to FIG. 7. For convenience of explanation, members having the same functions as those of the members explained in Embodiment 1 are denoted by the same reference numerals, and the explanation thereof will not be repeated. FIG. 7 is a partial cross-sectional view illustrating a hanging mechanism 1B in accordance with Embodiment 2.

The hanging mechanism 1B illustrated in FIG. 7 is used in the transfer system 10, as the above-described hanging mechanism 1. As illustrated in FIG. 7, the hanging mechanism 1B includes an upper mechanism 8 and a lower mechanism 9. The upper mechanism 8 is a mechanism that is supported on the ceiling 100. The lower mechanism 9 is a mechanism that is hung from the upper mechanism 8 so as to be connected with the upper mechanism 8.

The upper mechanism 8 includes a connecting member 71, hanging shafts 81 (first hanging member), and the nuts 82 and 83. Four sets of a hanging shaft 81 and nuts 82 and 83 are provided. The connecting member 71 is different from the connecting member 71 in the hanging mechanism 1A of Embodiment 1 in that the recessed surface portion 71a is disposed so as to face upward. In the hanging mechanism 1B, the recessed surface portion 71a forms a first connecting surface.

Although not illustrated, the hanging shaft 81 has an upper portion that penetrates through the ceiling 100 so as to protrude on an upper surface side of the ceiling 100. A male screw is formed at each of outer circumferences of top end portions and each of outer circumferences of bottom end portions of the hanging shafts 81. The nuts 82 are fitted onto the top end portions of the hanging shafts 81. When rotated, the nuts 82 move in an axial direction of the hanging shafts 81. In addition, nuts (upper nuts) that are not illustrated are fitted onto the top end portions of the hanging shafts 81 on the upper surface side of the ceiling 100.

The upper nuts and the nuts 82 sandwich the ceiling 100, so that the hanging shafts 81 are fixed to the ceiling 100. In addition, rotation of the upper nuts and the nuts 82 moves, upward or downward, the hanging shafts 81 with respect to the upper nuts and the nuts 82. In this way, the hanging shafts 81, the upper nuts, and the nuts 82 constitute a height adjustment mechanism (first height adjustment mechanism).

The bottom end portions of the hanging shafts 81 are inserted into the screw holes 71d of the connecting member 71 so as to be fitted to the screw holes 71d. The nuts 83 are fitted onto the bottom end portions of the hanging shafts 81. Rotation of the nuts moves, upward or downward, the bottom end portions of the hanging shafts 81 in the screw holes 71d. Thus, the hanging shafts 81 move upward or downward with respect to the nuts 83. In this way, the hanging shafts 81 and the nuts 83 constitute a height adjustment mechanism (first height adjustment mechanism).

The lower mechanism 9 includes a connecting member 91, a supporting board 92, a hanging shaft 93 (second hanging member), a connecting shaft 94, and a nut 95.

The connecting member 91 is a member that has a protruding curved surface (second connecting surface), specifically, a protruding spherical surface. The connecting member 91 has a spherical shape, but does not necessarily have a spherical shape. The connecting member 91 may have, for example, a hemispherical shape as long as the connecting member 71 has a protruding spherical surface as a surface to be in contact with the recessed surface portion 71a of the connecting member 71. The recessed surface portion 71a has a larger curvature radius than the connecting member 91.

The connecting member 91 is connected with a top end portion of the connecting shaft 94. Specifically, the connecting member 91 is provided, from a bottom end of the connecting member 91 to the center of the connecting member 91, with a hole 91a having a female screw. On the other hand, the connecting shaft 94 is provided with a male screw that is formed at an outer circumference of the top end portion of the connecting shaft 94. The top end portion of the connecting shaft 94 is connected with the hole 91a of the connecting member 91 by screw-fitting. Rotation of the connecting member 91 with respect to the connecting shaft 94 moves, upward or downward, a position at which the connecting member 91 and the connecting shaft 94 are screw-fitted to each other. This can change a height at which the connecting member 91 is connected with the connecting shaft 94. In this way, the connecting member 91 and the connecting shaft 94, which are screw-fitted to each other, constitute a height adjustment mechanism (second height adjustment mechanism).

The supporting board 92 is a plate-like member that has a substantially square shape. The hanging shaft 93 is jointed to a lower surface of the supporting board 92. The hanging shaft 93 is provided so as to extend downward and is connected with the corresponding one of the top board 31 of the storage shelf 3 and the upper surface portion 4a of the rail 4. The supporting board 92 is provided, at the center thereof, with a hole 92a that penetrates through both surfaces of the supporting board 92. In addition, the top end portion of the hanging shaft 93 is provided, at the center thereof, with a screw hole 93a that communicates with the hole 92a.

The connecting shaft 94 is provided with a male screw that is formed at an outer circumference of a lower portion of the connecting shaft 94. The lower portion of the connecting shaft 94 is inserted through the hole 92a of the supporting board 92 and is inserted into the screw hole 93a of the hanging shaft 93 so as to be fitted into the screw hole 93a. In addition, the nut 95 is fitted onto the lower portion of the connecting shaft 94. Rotation of the nut 95 moves, upward and downward, the lower portion of the connecting shaft 94 in the screw hole 93a. As a result, the connecting shaft 94 moves upward or downward with respect to the nut 95. In this way, the connecting shaft 94 and the nut 95 constitute a height adjustment mechanism (second height adjustment mechanism).

The connecting shaft 94 is inserted through the shaft hole 71b of the connecting member 71. The shaft hole 71b is formed so as to have a size, that is, a diameter large enough to prevent the connecting shaft 94 from touching an inner wall surface of the connecting member 71, which defines the shaft hole 71b, even in a case where the center of the connecting shaft 94 is tilted at a predetermined angle with respect to the shaft hole 71b of the connecting member 71.

In the hanging mechanism 1B, the connecting member 71 and the connecting member 91 constitute a connecting section 300. The connecting section 300 connects the hanging shafts 81 and the hanging shaft 93.

In the connecting section 300 of the hanging mechanism 1B configured as described above, the connecting member 91 is in contact with the recessed surface portion 71a of the connecting member 71. Thus, the spherical surface of the connecting member 91 slides with respect to the recessed surface portion 71a of the connecting member 71. Therefore, even in a case where the hanging shafts 81 are tilted with respect to a horizontal plane because the ceiling 100 is not horizontal but tilted and/or because the hanging shafts 81 are improperly fixed to the ceiling 100, the hanging shaft 93 can be directed vertically downward whereas the hanging shafts 81 are tilted. This makes it possible to easily keep the storage shelf 3, which is an object hung by the hanging shaft 93, horizontal. In addition, it is possible to attenuate lateral oscillation in a case where the lower mechanism 9 is oscillated laterally together with the storage shelf 3 or portions located lower than the rail 4. As a result, it is possible to attenuate influence of the lateral oscillation on the upper mechanism 8.

Furthermore, the spherical surface of the connecting member 91 is a protruding spherical surface, and the recessed surface portion 71a of the connecting member 71 is a recessed spherical surface. This allows the connecting member 91 to smoothly contact the recessed surface portion 71a. Thus, the connecting member 91 and the recessed surface portion 71a easily slide with respect to each other. This makes it possible to easily keep the storage shelf 3 horizontal. In addition, this makes it possible to enhance the effect of attenuating the lateral oscillation that occurs at portions located lower than the lower mechanism 9.

Furthermore, the recessed surface portion 71a of the connecting member 71 has a larger curvature radius than the connecting member 91. This reduces an area in which the spherical surface of the connecting member 91 is in contact with the recessed surface portion 71a of the connecting member 71. Thus, the connecting member 91 can more freely move with respect to the recessed surface portion 71a. In contrast, in a case where the spherical surface of the connecting member 91 has the same curvature radius as the recessed surface portion 71a of the connecting member 71, the respective spherical surfaces are fitted to each other. This makes the connecting member 91 unable to freely move with respect to the recessed surface portion 71a.

Furthermore, the connecting member 71 has a cut 71c. Thus, the lower mechanism 9 including the connecting shaft 94 can be detachably connected to the upper mechanism 8 by horizontally moving the connecting member 91 in a manner that the connecting shaft 94 of the lower mechanism 9 moves along the cut 71c. This makes it possible to bring, to an installation location of the hanging mechanism 1B, the hanging mechanism 1B in the form of separate parts, that is, the upper mechanism 8 including the hanging shaft 81 and the lower mechanism 9 including the connecting shaft 94.

As a result of fitting of the nuts 82 and 83 with respect to the hanging shafts 81, constituted is the height adjustment mechanism (first height adjustment mechanism) for adjusting the height of the connecting member 71 with respect to the ceiling 100. On the other hand, as a result of fitting of the connecting member 91 and the nut 95 with respect to the connecting shaft 94, constituted is the height adjustment mechanism (second height adjustment mechanism) for adjusting the height of the hanging shaft 93 with respect to the connecting member 91.

This makes it possible to adjust the respective heights of the connecting member 71 and the hanging member 93 in a condition where the hanging mechanism 1B is in the form of separate parts, that is, the upper mechanism 8 and the lower mechanism 9. Therefore, in a case where a heavy load is attached to the hanging shaft 93, the lower mechanism 9 and the upper mechanism 8 are connected with each other after the heights of the connecting member 71 and the hanging member 93 have been adjusted. This eliminates the need for adjusting the heights in a condition where the heavy load is attached. As a result, it is possible to reduce a burden of adjusting the heights.

Furthermore, the upper mechanism 8 is provided with the connecting member 71 in which the recessed curved surface (recessed spherical surface) is formed, and the lower mechanism 9 is provided with the connecting member 91 in which the protruding curved surface (protruding spherical surface) is formed.

Furthermore, the storage shelf 3 for accommodating a container 5 is attached to the hanging shaft 93. Therefore, it is possible to easily keep the storage shelf 3 horizontal. This makes it possible to stably accommodate the container 5. In addition, even in a case where the storage shelf 3 oscillates laterally, it is possible to attenuate the lateral oscillation. The attenuation of the lateral oscillation also makes it possible to stably accommodate the container 5.

Furthermore, the rail 4 on which the ceiling carrier 2 travels is attached to the hanging shaft 93. Therefore, it is possible to easily keep the ceiling carrier 2, which travels on the rail 4, horizontal. This allows the ceiling carrier 2 to stably travel. In addition, even in a case where the ceiling carrier 2 oscillates laterally, it is possible to attenuate the lateral oscillation. The attenuation of the lateral oscillation also allows the ceiling carrier 2 to stably travel.

In order to solve the foregoing problem, a hanging mechanism in accordance with an aspect of the present invention includes: a first hanging member to be hung from a support part; a second hanging member supported so as to be hung from the first hanging member; and a connecting section connecting the first hanging member and the second hanging member to each other, the connecting section including: a first connecting surface that is provided on a first hanging member side; and a second connecting surface that is provided on a second hanging member side and that is in contact with the first connecting surface. One of the first connecting surface and the second connecting surface is a protruding curved surface, and the other of the first connecting surface and the second connecting surface is a recessed curved surface.

According to the above-described configuration, in the connecting section, the protruding curved surface is in contact with the recessed curved surface. Thus, even in a case where the first hanging member is tilted with respect to a horizontal plane, the protruding curved surface slides with respect to the recessed curved surface, or the recessed curved surface slides with respect to the protruding curved surface. Therefore, the second hanging member can be directed vertically downward whereas the first hanging member is tilted. As a result, it is possible to easily keep an object, which is hung by the second hanging member, horizontal.

In the hanging mechanism, one of the first connecting surface and the second connecting surface is a protruding spherical surface, and the other of the first connecting surface and the second connecting surface is a recessed spherical surface.

According to the above-described configuration, the first connecting surface can more smoothly contact the second connecting surface. This allows the protruding spherical surface and the recessed spherical surface to slide with respect to each other. Therefore, it is possible to more easily keep the object, which is hung, horizontal.

In the hanging mechanism, the recessed spherical surface has a larger curvature radius than the protruding spherical surface.

The above-described configuration reduces an area in which the protruding spherical surface is in contact with the recessed spherical surface. In this case, unlike in a case where both spherical surfaces have the same curvature radius, the protruding spherical surface and the recessed spherical surface are prevented from being fitted to each other. This allows the protruding spherical surface to more freely move with respect to the recessed spherical surface.

In the hanging mechanism, the second hanging member is detachably connected, in the connecting section, to the first hanging member.

According to the above-described configuration, it is possible to bring, to the installation location of the hanging mechanism, the hanging mechanism in the form of separate parts, that is, the first hanging member and the second hanging member.

The hanging mechanism includes: a first height adjustment mechanism for adjusting a height of the first connecting surface with respect to the support part; and a second height adjustment mechanism for adjusting a height of the second hanging member with respect to the first connecting surface.

According to the above-described configuration, it is possible to adjust respective heights of the first hanging member and the second hanging member in a condition in which the hanging mechanism is in the form of separate parts, that is, the first hanging member and the second hanging member. Therefore, in a case where a heavy load is attached to the second hanging member, the first hanging member and the second hanging member are connected to each other after the heights of the first hanging member and the second hanging member have been adjusted. This eliminates the need for adjusting the heights in a condition where the heavy load is attached. As a result, it is possible to reduce a burden of adjusting the heights.

In the hanging mechanism, the first connecting surface may be protruding curved surface, and the second connecting surface may be a recessed curved surface. Alternatively, in the hanging mechanism, the first connecting surface may be a recessed curved surface, and the second connecting surface may be a protruding curved surface.

In the hanging mechanism, a storage body for accommodating an object is attached to the second hanging member.

According to the above-described configuration, it is possible to easily keep the storage body horizontal. This makes it possible to stably accommodate the object.

In the hanging mechanism, the support part is a ceiling, and a rail on which a ceiling carrier travels is attached to the second hanging member.

According to the above-described configuration, it is possible to easily keep the ceiling carrier, which travels on the rail, horizontal. This allows the ceiling carrier to stably travel.

ADDITIONAL REMARKS

The present invention is not limited to the embodiments described above, but may be altered in various ways by a skilled person within the scope of the claims. Any embodiment based on a proper combination of technical means disclosed in the embodiments is also encompassed in the technical scope of the present invention.

REFERENCE SIGNS LIST 1, 1A, 1B Hanging mechanism
3 Storage shelf (storage body)
5 Container (object)
61 Hanging shaft (first hanging member, first height adjustment mechanism)
62 Connecting member (first connecting surface, protruding curved surface, protruding spherical surface, first height adjustment mechanism)
63 Nut (first height adjustment mechanism)
71a Recessed surface portion (first connecting surface, second connecting surface, recessed spherical surface)
73 Hanging shaft (second hanging member)
74, 94 Connecting shaft (second height adjustment mechanism)
75, 76, 95 Nut (second height adjustment mechanism)
81 Hanging shaft (first hanging member, first height adjustment mechanism)
82, 83 Nut (first height adjustment mechanism)
91 Connecting member (second connecting surface, protruding curved surface, protruding spherical surface, second height adjustment mechanism)
93 Hanging shaft (second hanging member)
100 Ceiling (support part)
200, 300 Connecting section

The invention claimed is:

1. A hanging mechanism comprising:
a first hanging member to be hung from a support part;
a second hanging member supported so as to be hung from the first hanging member; and
a connecting section connecting the first hanging member and the second hanging member to each other,
the connecting section including:
a first connecting member connected with the first hanging member; and
a second connecting member connected with the second hanging member,
the first connecting member including a first connecting surface,
the second connecting member including a second connecting surface in contact with the first connecting surface,
one of the first connecting surface and the second connecting surface being a protruding curved surface, and the other of the first connecting surface and the second connecting surface being a recessed curved surface,
one of the first connecting member and the second connecting member which one has the recessed curved surface including a through hole through which a shaft part connected with the other of the first connecting member and the second connecting member is inserted and a cut formed from the through hole to a side surface of the other of the first connecting member and the second connecting member.

2. The hanging mechanism according to claim 1, wherein one of the first connecting surface and the second connecting surface is a protruding spherical surface, and the other of the first connecting surface and the second connecting surface is a recessed spherical surface.

3. The hanging mechanism according to claim 1, wherein the second hanging member is detachably connected, in the connecting section, to the first hanging member.

4. The hanging mechanism according to claim 1, wherein the first connecting surface is a protruding curved surface, and the second connecting surface is a recessed curved surface.

5. The hanging mechanism according to claim 1, wherein the first connecting surface is a recessed curved surface, and the second connecting surface is a protruding curved surface.

6. The hanging mechanism according to claim 1, wherein a storage body for accommodating an object is attached to the second hanging member.

7. The hanging mechanism according to claim 1, wherein:
the support part is a ceiling; and
a rail on which a ceiling carrier travels is attached to the second hanging member.

8. A hanging mechanism comprising:
a first hanging member to be hung from a support part;
a second hanging member supported so as to be hung from the first hanging member; and
a connecting section connecting the first hanging member and the second hanging member to each other,
the connecting section including:
a first connecting member connected with the first hanging member; and
a second connecting member connected with the second hanging member,
the first connecting member including a first connecting surface,
the second connecting member including a second connecting surface in contact with the first connecting surface,
one of the first connecting surface and the second connecting surface being a protruding curved surface, and the other of the first connecting surface and the second connecting surface being a recessed curved surface,
wherein one of the first connecting surface and the second connecting surface is a protruding spherical surface, and the other of the first connecting surface and the second connecting surface is a recessed spherical surface, and wherein the recessed spherical surface has a larger curvature radius than the protruding spherical surface.

9. A hanging mechanism comprising:
a first hanging member to be hung from a support part;
a second hanging member supported so as to be hung from the first hanging member;
a connecting section connecting the first hanging member and the second hanging member to each other, the connecting section including:
a first connecting surface that is provided on a first hanging member side; and
a second connecting surface that is provided on a second hanging member side and that is in contact with the first connecting surface, one of the first connecting surface and the second connecting surface being a protruding curved surface, and the other of the first connecting surface and the second connecting surface being a recessed curved surface;
a first height adjustment mechanism for adjusting a height of the first connecting surface with respect to the support part; and
a second height adjustment mechanism for adjusting a height of the second hanging member with respect to the first connecting surface.

* * * * *